(12) United States Patent
Lai

(10) Patent No.: US 10,283,519 B2
(45) Date of Patent: May 7, 2019

(54) THREE DIMENSIONAL NAND STRING MEMORY DEVICE

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/665,103

(22) Filed: Mar. 23, 2015

(65) Prior Publication Data

US 2016/0284722 A1    Sep. 29, 2016

(51) Int. Cl.
*H01L 29/66* (2006.01)
*H01L 29/04* (2006.01)
(Continued)

(52) U.S. Cl.
CPC .. *H01L 27/11582* (2013.01); *H01L 21/30604* (2013.01); *H01L 21/31* (2013.01);
(Continued)

(58) Field of Classification Search
CPC ......... H01L 27/11582; H01L 27/11568; H01L 27/11578; H01L 27/11556; H01L 27/108; H01L 27/10897; H01L 27/11; H01L 27/1116; H01L 21/28282; H01L 21/30604; H01L 21/31; H01L 21/31116; H01L 21/441; H01L 21/465; H01L 21/469; H01L 21/47573; H01L 21/76877; H01L 29/04; H01L 29/16; H01L 29/24; H01L 29/4234; H01L 29/66833; H01L 29/66969; H01L 29/7926; H01L 29/78; H01L 29/1095;
(Continued)

(56) References Cited

U.S. PATENT DOCUMENTS

| 7,851,849 B2 * | 12/2010 | Kiyotoshi ......... H01L 27/11573 257/324 |
| 2008/0087942 A1 * | 4/2008 | Hsu ....................... H01L 27/115 257/324 |

(Continued)

FOREIGN PATENT DOCUMENTS

| CN | 103730470 A | 4/2014 |
| TW | 201238033 A1 | 9/2012 |
| TW | 201301446 A1 | 1/2013 |

OTHER PUBLICATIONS

TIPO Office Action dated Nov. 10, 2016 in Taiwan application (No. 104109447).
(Continued)

*Primary Examiner* — Natalia A Gondarenko
(74) *Attorney, Agent, or Firm* — McClure, Qualey & Rodack, LLP

(57) ABSTRACT

A memory device including a substrate, at least one first stacked structure and at least one second stacked structure disposed on the substrate is provided. The first stacked structure includes a plurality of alternately stacked metal layers and oxide layers. The second stacked structure is disposed adjacent to the first stacked structure and includes a plurality of alternately stacked semiconductor layers and oxide layers. The metal layers of the first stacked structure are connected to the semiconductor layers of the second stacked structure.

21 Claims, 9 Drawing Sheets

(51) Int. Cl.
  *H01L 29/16* (2006.01)
  *H01L 29/24* (2006.01)
  *H01L 29/423* (2006.01)
  *H01L 29/792* (2006.01)
  *H01L 27/115* (2017.01)
  *H01L 21/31* (2006.01)
  *H01L 21/311* (2006.01)
  *H01L 21/306* (2006.01)
  *H01L 21/465* (2006.01)
  *H01L 21/469* (2006.01)
  *H01L 27/11582* (2017.01)
  *H01L 21/4757* (2006.01)
  *H01L 27/11565* (2017.01)
  *H01L 21/441* (2006.01)
  *H01L 21/28* (2006.01)
  *H01L 21/768* (2006.01)

(52) U.S. Cl.
  CPC ...... *H01L 21/31116* (2013.01); *H01L 21/465* (2013.01); *H01L 21/469* (2013.01); *H01L 21/47573* (2013.01); *H01L 27/11565* (2013.01); *H01L 29/66833* (2013.01); *H01L 29/66969* (2013.01); *H01L 29/7926* (2013.01)

(58) Field of Classification Search
  CPC . H01L 29/7395; H01L 29/086; H01L 29/408; H01L 29/0696; H01L 29/0634; H01L 29/402; H01L 29/42376; H01L 29/0619; H01L 29/40; H01L 29/06; H01L 29/10; H01L 29/739; H01L 29/423; H01L 29/66712–66734; H01L 29/7802–7815; H01L 29/66666; H01L 29/7827–7828; H01L 29/78642; H01L 29/08; H01L 27/085–098; H01L 27/0922; H01L 27/105; H01L 27/11526; H01L 27/11546; H01L 21/8232–8239; H01L 21/823462; H01L 21/823842; H01L 21/823857; H01L 21/823487; H01L 2924/1434; H01L 2924/1443; H01L 2924/1435; H01L 2924/1436; H01L 27/11524; H01L 27/11529; H01L 27/1157; H01L 27/11565; H01L 2924/1438; H01L 2924/145; H01L 2924/14511; H01L 2924/1453
  USPC ....... 257/43, 324, 315, 316, 5; 438/104, 241
  See application file for complete search history.

(56) References Cited

U.S. PATENT DOCUMENTS

| | | |
|---|---|---|
| 2009/0294751 A1 | 12/2009 | Kiyotoshi |
| 2011/0032772 A1 | 2/2011 | Aritome |
| 2011/0045657 A1 | 2/2011 | Kim et al. |
| 2012/0327714 A1 | 12/2012 | Lue |
| 2013/0307047 A1* | 11/2013 | Sakuma ............ H01L 29/66825 257/316 |
| 2015/0041879 A1* | 2/2015 | Jayanti ............. H01L 21/28282 257/324 |
| 2015/0069377 A1* | 3/2015 | Rabkin .............. H01L 27/1225 257/43 |
| 2015/0108562 A1* | 4/2015 | Chen ................. H01L 27/11582 257/324 |
| 2015/0348984 A1* | 12/2015 | Yada ................. H01L 27/11582 257/316 |
| 2016/0126248 A1* | 5/2016 | Rabkin ................ H01L 29/408 257/321 |

OTHER PUBLICATIONS

CN Office Action dated Jul. 4, 2018 in Chinese application (No. 201510144177.3).

\* cited by examiner

THREE DIMENSIONAL NAND STRING MEMORY DEVICE

BACKGROUND

Technical Field

The disclosure relates in general to a memory device and a manufacturing method of the same.

Description of the Related Art

Memory devices are used in storage elements for many products such as MP3 players, digital cameras, computer files, etc. As the application increases, the demand for the memory device focuses on small size and large memory capacity. It is desired to manufacture a memory having a high element density for satisfying the requirement.

Designers develop a method for improving a memory device density, using 3D stack memory device so as to increase a memory capacity and decrease a cost per cell. However, word lines in 3D stack memory may suffer from larger word line capacitance due to the repeated conductor and dielectric stacked structure. Therefore, it is an important lesson to manufacture a 3D stack memory device which can effectively reduce the word line capacitance.

SUMMARY

The disclosure is directed to a memory device and a manufacturing method of the same. The memory device in the disclosure may effectively reduce the word line capacitance by inserting the thin film transistor (TFT) structure to control the on/off state of the word line, which may reduce much word line capacitance.

According to one embodiment, a memory device including a substrate, at least one first stacked structure and at least one second stacked structure disposed on the substrate is provided. The first stacked structure includes a plurality of alternately stacked metal layers and oxide layers. The second stacked structure is disposed adjacent to the first stacked structure and includes a plurality of alternately stacked semiconductor layers and oxide layers. The metal layers of the first stacked structure are connected to the semiconductor layers of the second stacked structure.

According to another embodiment, a manufacturing method of a memory device is provided. The manufacturing method includes the following steps. A plurality of oxide layers and silicon nitride layers are alternately stacked on a substrate. At least one first through hole is formed to penetrate the oxide layers and the silicon nitride layers. A charge storage layer and a channel layer are sequentially deposited in the first through hole. A dielectric structure is deposited to fill the first through hole. At least one second through hole is formed on a predetermined area. The silicon nitride layers in the predetermined area are removed. A plurality of semiconductor layers are formed between the oxide layers in the predetermined area. At least one gate oxide layer is deposited on surfaces of the semiconductor layers in the second through hole. A gate structure is filled in the second through hole. A third through hole is formed to penetrate the oxide layers and the silicon nitride layers out of the predetermined area. The silicon nitride layers out of the predetermined area are removed. Metal material is formed between the oxide layers out of the predetermined area to form a plurality of metal layers.

Figure 1:
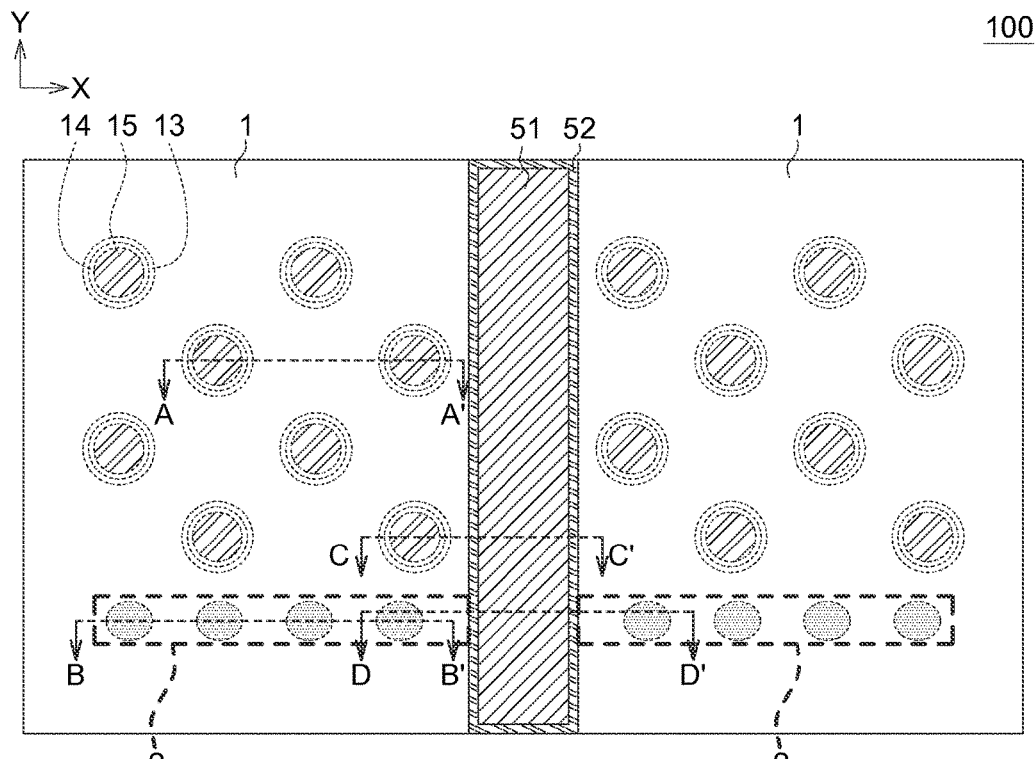
FIG. 1 illustrates a top view of a semiconductor structure in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and there may be other embodiments of the present disclosure which are not specifically illustrated. Thus, the specification and the drawings are regarded as an illustrative sense rather than a restrictive sense.

Figure 2A:
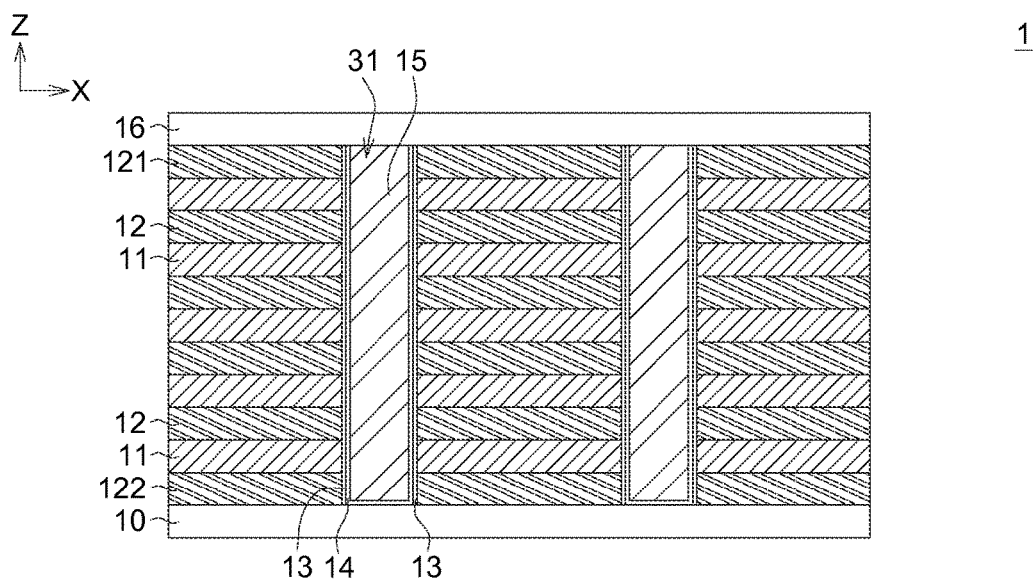
FIG. 2A illustrates a cross-sectional view of the semiconductor structure along A-A' line in FIG. 1.
Figure 2B:
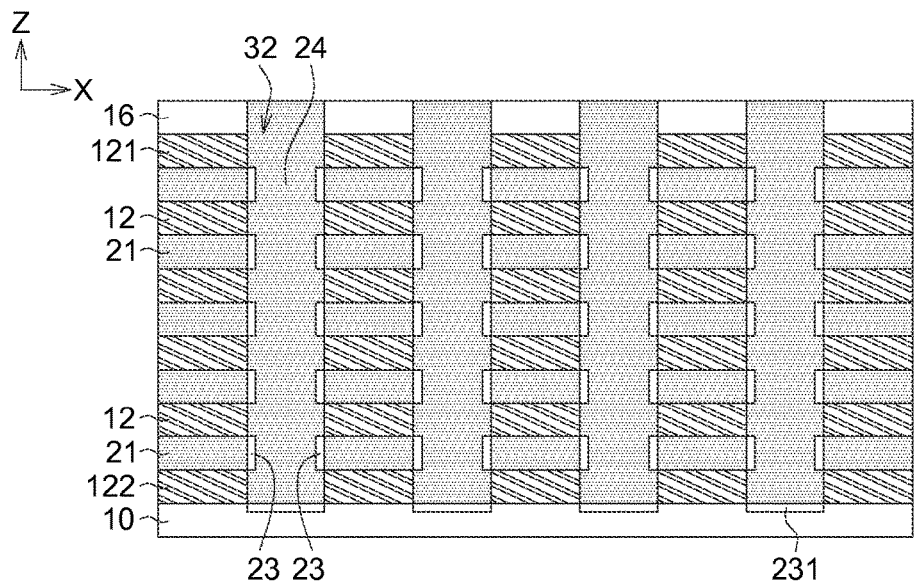
FIG. 2B illustrates a cross-sectional view of the semiconductor structure along B-B' line in FIG. 1.
Figure 2C:
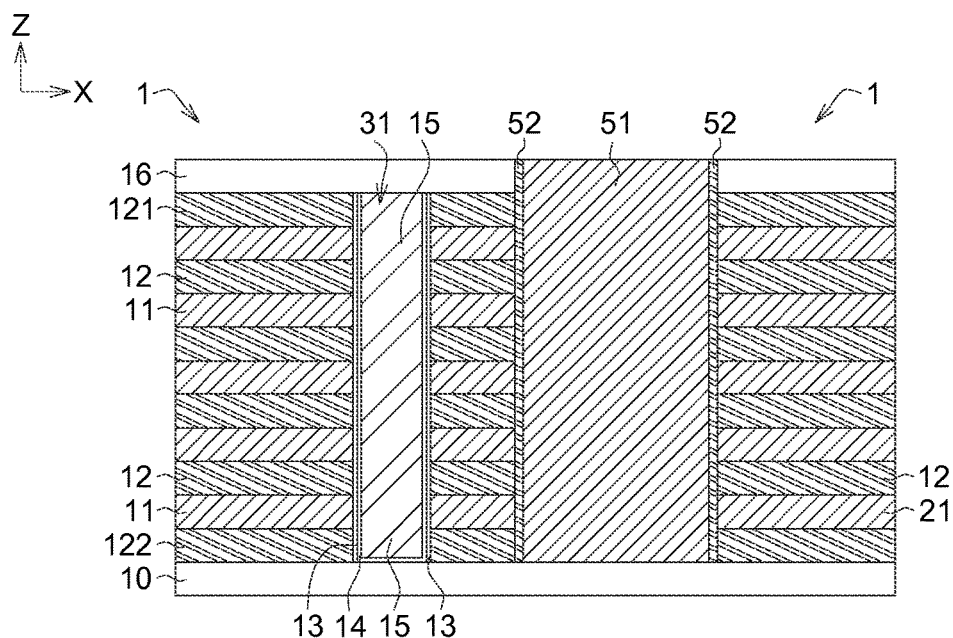
FIG. 2C illustrates a cross-sectional view of the semiconductor structure along C-C' line in FIG. 1.
Figure 2D:
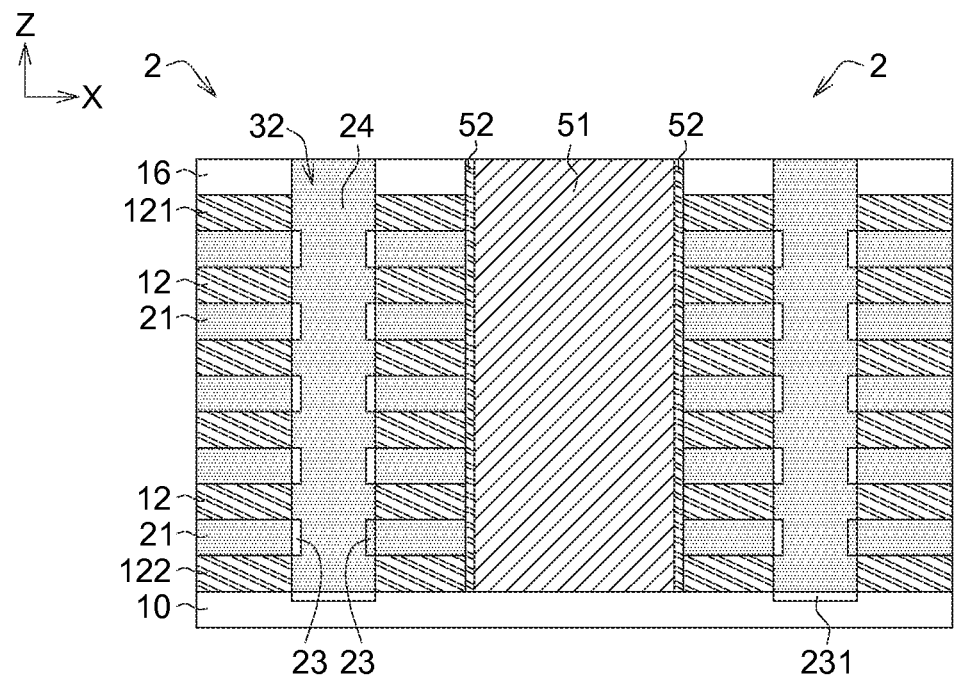
FIG. 2D illustrates a cross-sectional view of the semiconductor structure along D-D' line in FIG. 1.

FIG. 1 illustrates a top view of a semiconductor structure 100 in one embodiment according to the disclosure. FIG. 2A illustrates a cross-sectional view of the semiconductor structure 100 along A-A' line in FIG. 1. FIG. 2B illustrates a cross-sectional view of the semiconductor structure 100 along B-B' line in FIG. 1. FIG. 2C illustrates a cross-sectional view of the semiconductor structure 100 along C-C' line in FIG. 1. FIG. 2D illustrates a cross-sectional view of the semiconductor structure 100 along D-D' line in FIG. 1. The memory device 100 in the embodiment according to the disclosure includes a substrate 10, at least one first stacked structure 1 and at least one second stacked structure 2 disposed adjacent to the first stacked structure 1. The first stacked structure 1 and the second stacked structure 2 are both disposed on the substrate 10.

As shown in FIG. 1 and FIG. 2A, the first stacked structure 1 includes a plurality of alternately stacked metal layers 11 and oxide layers 12. The first stacked structure 1 may include at least one first through hole 31, a charge storage layer 13 and a channel layer 14. The first through hole 31 penetrates the metal layers 11 and the oxide layers 12, and exposes a portion of the surface of the substrate 10. The charge storage layer 13 is disposed on the side wall of the first through hole 31. The channel layer 14 is disposed on the charge storage layer 13 and the exposed portion of the surface of the substrate 10.

For example, the charge storage layer 13 may be a silicon oxide/silicon nitride/silicon oxide/silicon nitride/silicon oxide (ONONO) structure, and the channel layer 14 may include polysilicon or indium gallium zinc oxide (IGZO). But the disclosure is not limited thereto.

Further, the first stacked structure 1 may include a dielectric structure 15 filled in the first through hole 31. That is, the dielectric structure 15 may be disposed on the surface of the channel layer 14 and fill the remained spaces of the first through hole 31.

In one embodiment, the oxide layer 121 on the top portion of the first stacked structure 1 may be used as a hard mask (HM) layer, and the oxide layer 122 on the bottom portion of the first stacked structure 1 may be used as a buried oxide layer. Besides, the stacked structure 1 may also include a cap layer 16. That is, the cap layer 16 may cover the upper surfaces of the oxide layer (hard mask layer) 121 and the dielectric structure 15.

In the embodiment according to the disclosure, the first stacked structure 1 may further include a high dielectric material layer (not shown in the Figures) disposed between the metal layers 11 and the oxide layers 12 to form a high-K metal gate (HKMG) structure.

As shown in FIG. 1 and FIG. 2B, the second stacked structure 2 includes a plurality of alternately stacked semiconductor layers 21 and oxide layers 12, and the semiconductor layers 21 of the second stacked structure 2 are connected to the metal layers 11 of the first stacked structure 1. The second stacked structure 2 may include at least one second through hole 32, at least one gate oxide layer 23 and a gate structure 24. The second through hole 32 penetrates the semiconductor layers 21 and the oxide layers 12, and exposes a portion of the surface of the substrate 10. The gate oxide layer 23 is disposed in the second through hole 32 and on the surface of at least one of the semiconductor layers 21. The gate structure 24 fills the second through hole 32. In one embodiment, the gate oxide layer 23 may also be disposed on the exposed portion of the surface of the substrate 10, such as the gate oxide layer 231 illustrated in FIG. 2B.

In the embodiment according to the disclosure, the memory device 100 may include a plurality of the first stacked structures 1 and the second stacked structures 2 as show in FIG. 2C and FIG. 2D. Besides, the memory device 100 may further include at least one conductive structure 51 and at least one oxide spacer 52. The conductive structure 51 may be disposed between the first stacked structures 1 (or between the second stacked structures 2), and the oxide spacer 52 may be disposed between the first stacked structures 1 (or the second stacked structures 2) and the conductive structure 51. For example, FIG. 1, FIG. 2C and FIG. 2D show two first stacked structures 1 and two second stacked structures 2, and the conductive structure 51 is disposed between the two first stacked structures 1 (or between the two second stacked structures 2). The oxide spacer 52 separates the first stacked structures 1 (or the second stacked structures 2) from the conductive structure 51. The conductive structure 51 may be a source line to connect bottom NAND string source side (not drawn).

In one embodiment, the conductive structure 51 may, for example, include TiN/W or TaN/W, the metal layers 11 of the first stacked structure 1 may include TiN/W, and the semiconductor layers 21 may include undoped polysilicon. The conductive structure 51 made of TiN/W may be used to reduce source line resistance.

Figure 3A:
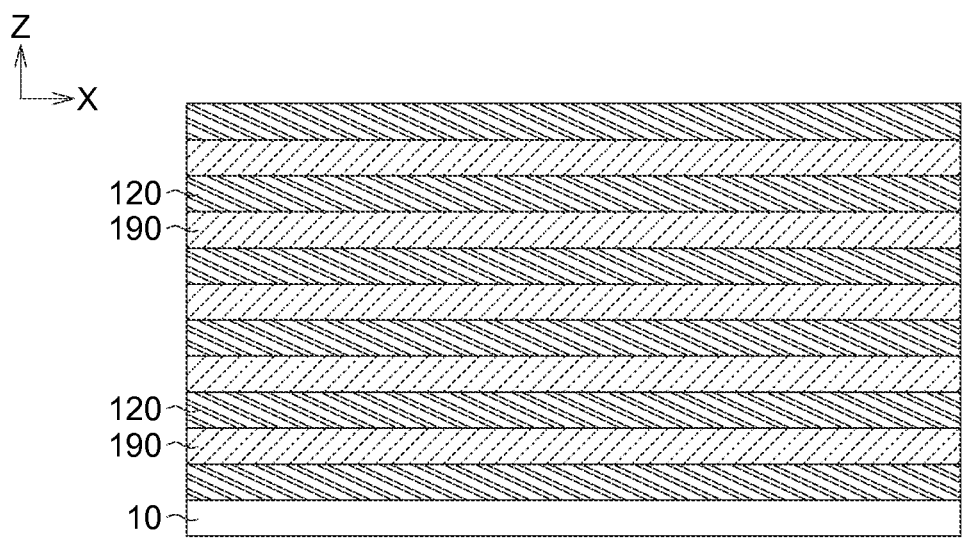
FIG. 3A to FIG. 9 illustrate a process for manufacturing a memory device in one embodiment according to the disclosure.

FIG. 3A to FIG. 9 illustrate a process for manufacturing a memory device 100 in one embodiment according to the disclosure. First, a plurality of oxide layers 120 and silicon nitride layers 190 are alternately stacked on a substrate 10 as shown in FIG. 3A. Here, the substrate 10 may be such as a P-type silicon substrate.

Figure 3B:
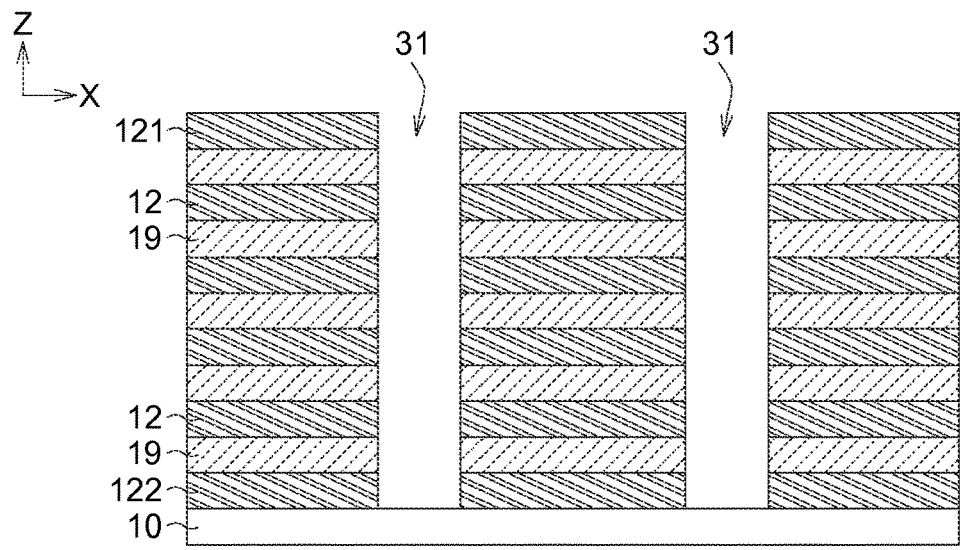

Then, at least one first through hole 31 are formed to penetrate the oxide layers 120 and the silicon nitride layers 190 and expose a portion of the surface of the substrate 10 as shown in FIG. 3B. Hence, a plurality of alternately stacked oxide layers 12 and silicon nitride layers 19 are formed. In this embodiment, the oxide layer 121 disposed on the top portion may be a hard mask layer, and the oxide layer 122 disposed on the bottom portion may be a buried oxide layer. Besides, the first through hole 31 may be formed by a photolithography etching process.

Figure 3C:
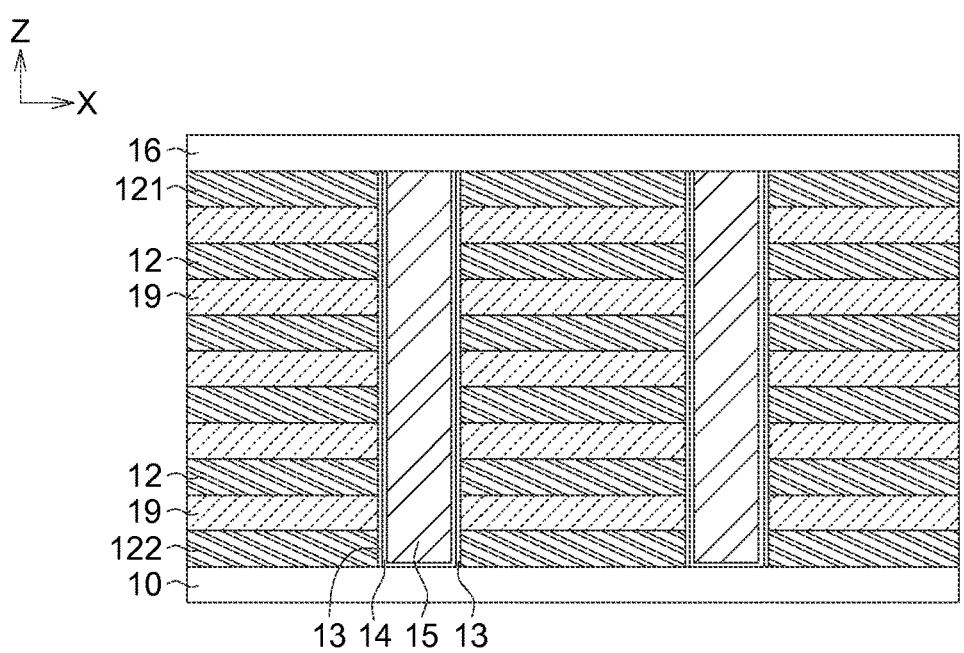

As shown in FIG. 3C, a charge storage layer 13 and a channel layer 14 are sequentially deposited in the first through hole 31. In this embodiment, the charge storage layer 13 may be, for example, deposited on the side wall of the first through hole 31 and expose a portion of the surface of the substrate 10, and the channel layer 14 may be deposited on the charge storage layer 13 and the exposed portion of the surface of the substrate 10. Besides, the charge storage layer 13 may be a silicon oxide/silicon nitride/silicon oxide (ONO) structure, a silicon oxide/silicon nitride/silicon oxide/silicon nitride/silicon oxide (ONONO) structure, or a silicon oxide/silicon nitride/silicon oxide/silicon nitride/silicon oxide/silicon nitride/silicon oxide (ONONONO) structure. Then, a dielectric structure 15 is deposited to fill the first through hole 31.

A cap layer 16 is then formed on the dielectric structure 15 and the alternately stacked oxide layers 12 and the silicon nitride layers 19 (for example, on the dielectric structure 15 and the oxide layer 121). In one embodiment, the upper surfaces of the dielectric structure 15 and the alternately stacked oxide layers 12 and the silicon nitride layers 19 may be flattened before forming the cap layer 16. For example, a chemical mechanic polish (CMP) process may be implemented, and stopped on the oxide layer (hard mask layer) 121. The dielectric structure 15 may form air gap structure to reduce capacitance and coupling effect.

Figure 4:
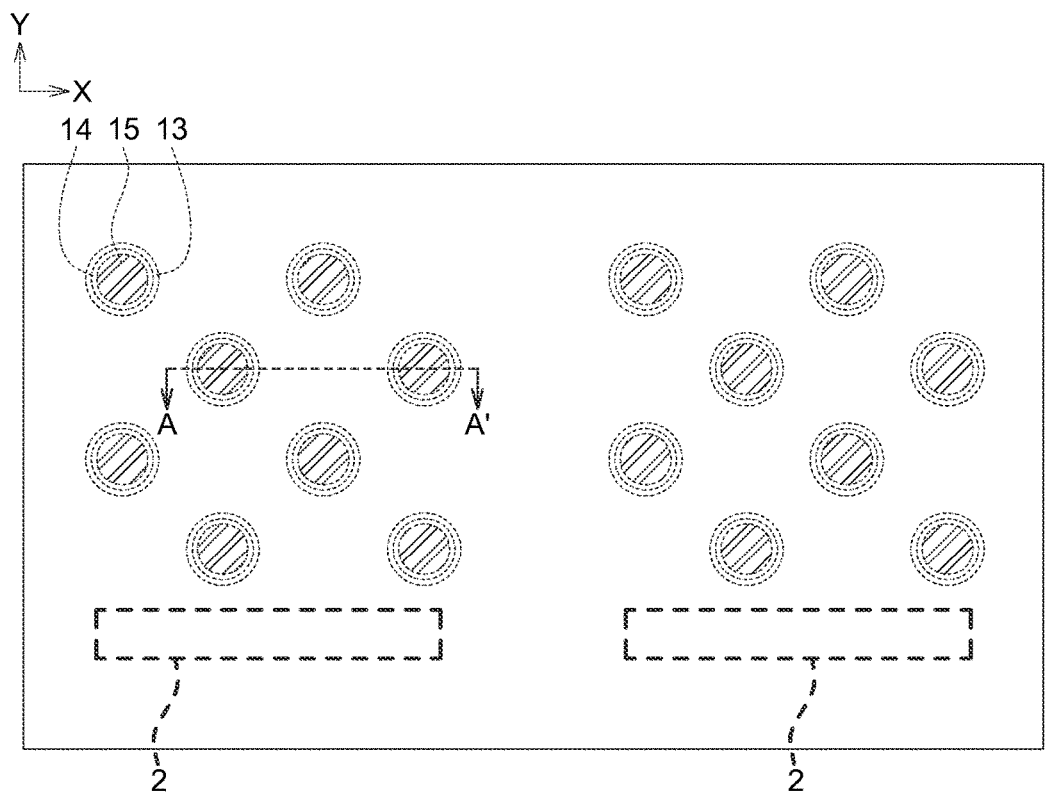

FIG. 4 illustrates the top-view of the manufacturing embodiment in the present stage. That is, FIG. 3C may be such as a cross-section view of the structure along A-A' line in FIG. 4. In FIG. 4, the area enclosed by the dashed line is a predetermined area of the second stacked structure 2, and the area out of the dashed line is a predetermined area of the first stacked structure 1. That is, the continuous steps shown in FIG. 5A to FIG. 5D may be implemented in the predetermined area of the second stacked structure 2.

Figure 5A:
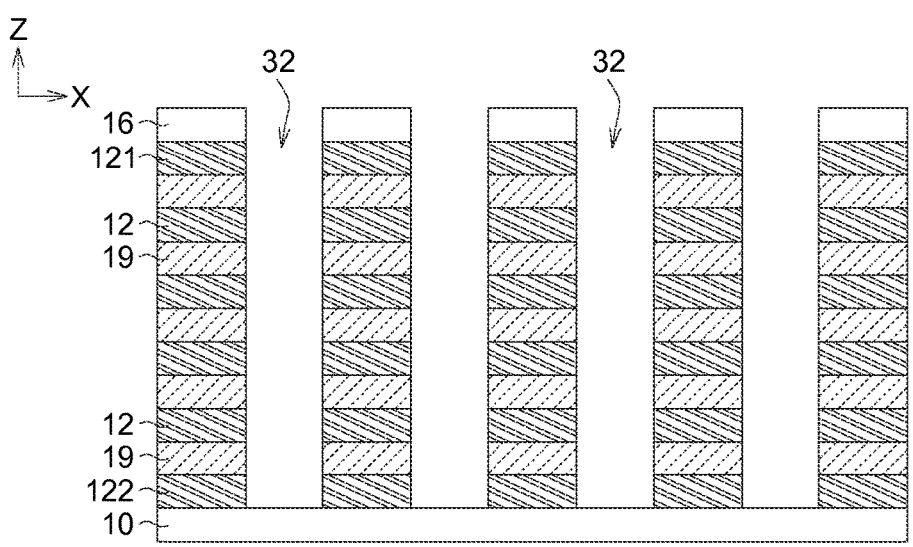

As shown in FIG. 5A, at least one second through hole 32 is formed in the predetermined area of the second stacked structure 2. The second through hole 32 penetrates the oxide layers 120, the silicon nitride layers 190 and the cap layer 16, and exposes a portion of the surface of the substrate 10, such that a plurality of alternately stacked oxide layers 12 and silicon nitride layers 19 are formed. Similarly, the oxide layer 121 disposed on the top portion may be a hard mask layer, and the oxide layer 122 disposed on the bottom portion may be a buried oxide layer. Besides, the second through hole 32 may be formed by a photolithography etching process.

Here, the critical dimension (CD) of the second through hole 32 may be different from the critical dimension of the first through hole 31.

Figure 5B:
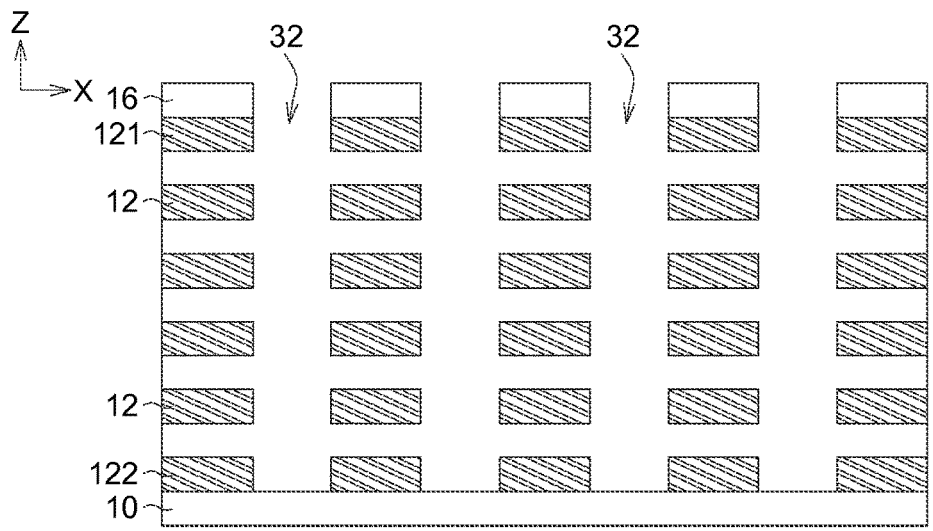

Then, the silicon nitride layers 19 in the predetermined area of the second stacked structure 2 are removed as shown in FIG. 5B. For example, the chemical dry etching (CDE) or phosphoric acid ($H_3PO_4$) may be used to remove the silicon nitride layers 19. The chemical dry etching or phosphoric acid may have much higher selectivity to oxide. Therefore, the silicon nitride layers 19 may be removed, but the oxide layers 12 may be remained.

Figure 5C:
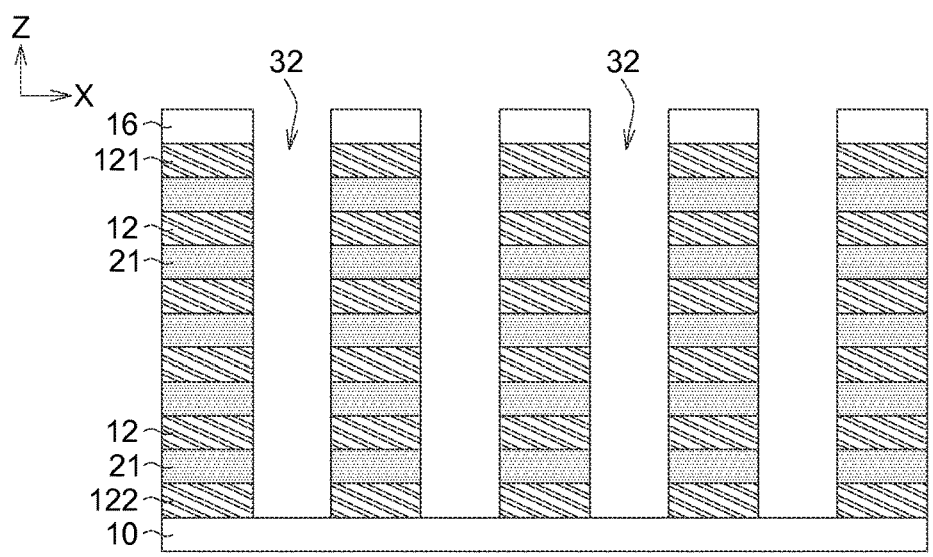

As shown in FIG. 5C, semiconductor layers 21 are deposited between the oxide layers 12. Here, the semiconductor layers 21 may, for example, include undoped polysilicon or intrinsic polysilicon. It will be a channel material controlled by gate structure 24 formed later (in FIG. 2B).

Figure 5D:
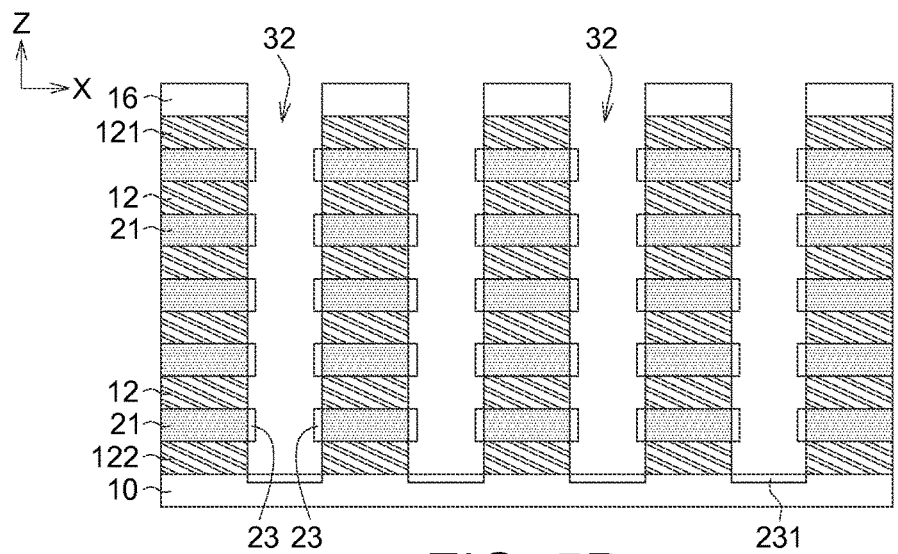

Then, at least one gate oxide layer 23 is deposited in the second through hole 32 and on the surface of at least one of the semiconductor layers 21 as shown in FIG. 5D. In one embodiment, the gate oxide layer 23 may also be disposed on the exposed portion of the surface of the substrate 10, such as the gate oxide layer 231. Here, the thickness of the gate oxide layer 23 may be between 50 and 500 Å, such as between 300 and 400 Å. The gate oxide layer 23 should sustain higher word line voltage operation.

Figure 6:
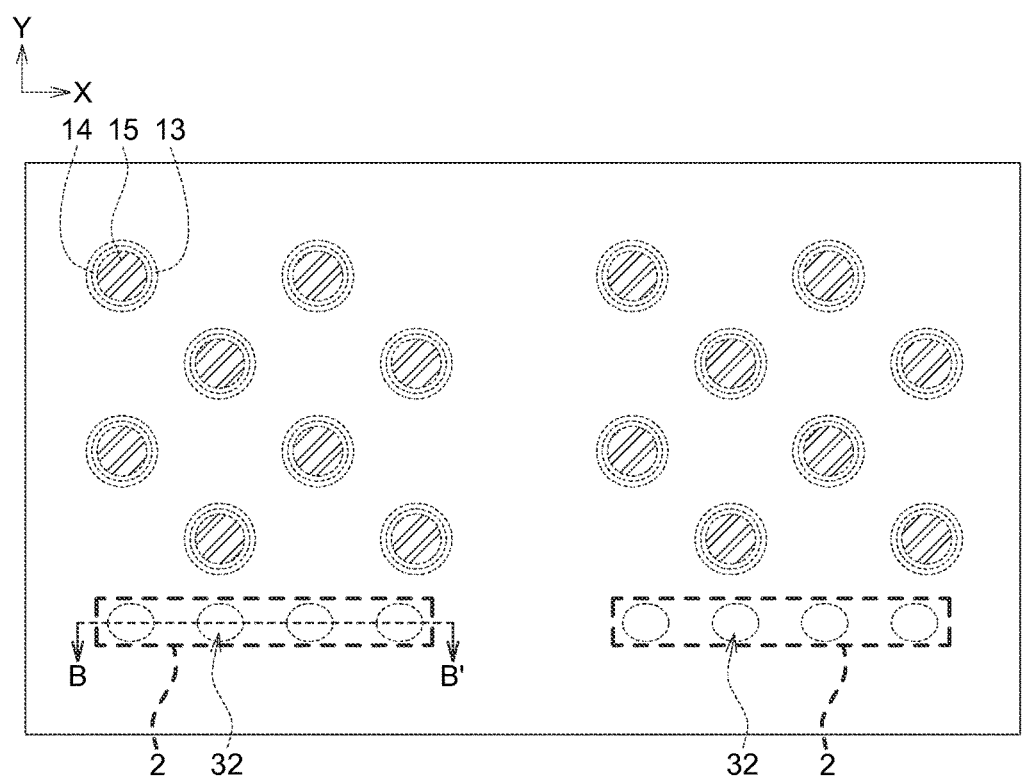

FIG. 6 illustrates the top-view of the manufacturing embodiment in the present stage. That is, FIG. 5D may be such as a cross-section view of the structure along B-B' line in FIG. 6.

Then, the second through hole 32 is filled by a gate structure 24, such that the second stacked structure 2 as shown in FIG. 2B is formed. Here, the gate structure 24 may include N+ polysilicon or metal, such as TiN/W. That is, the second stacked structure 2 may be used as a thin film transistor (TFT) structure, the gate structure 24 may be the gate of the TFT structure, and the semiconductor layers 21 may be the channels of the TFT structure.

Figure 7:
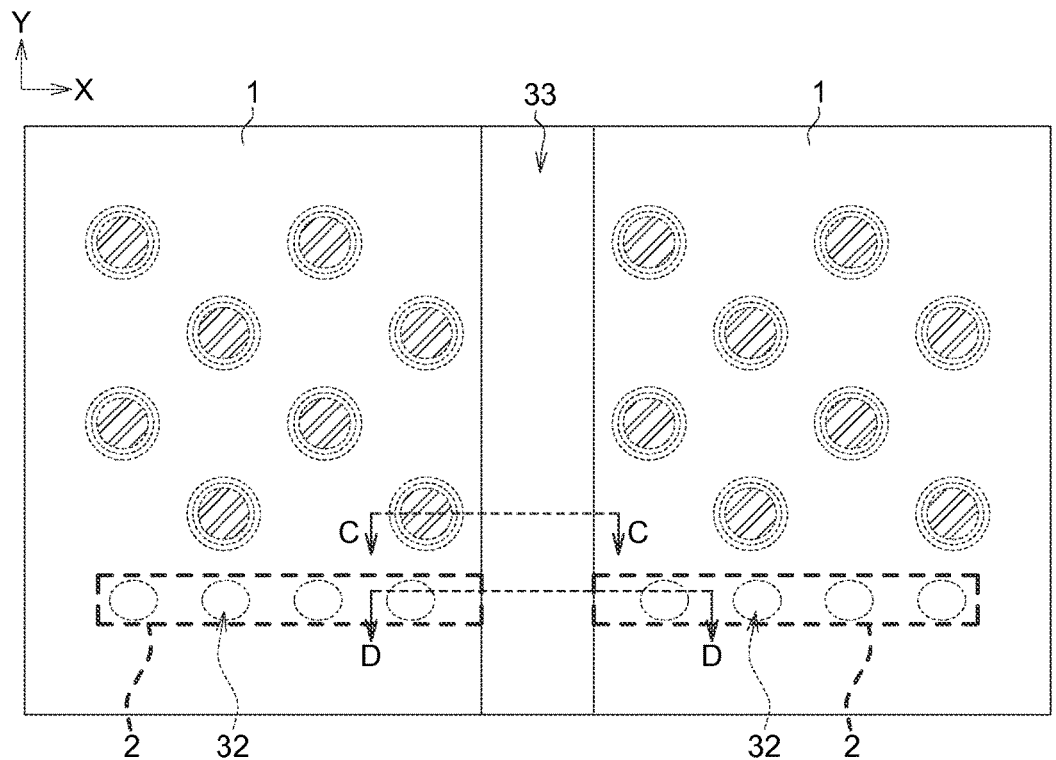
Figure 8A:
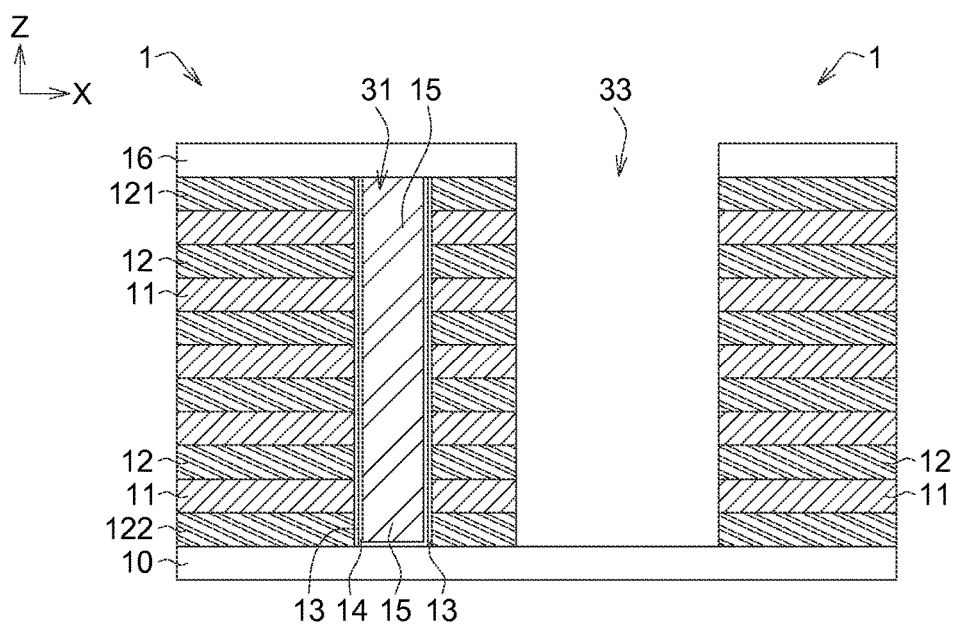
Figure 8B:
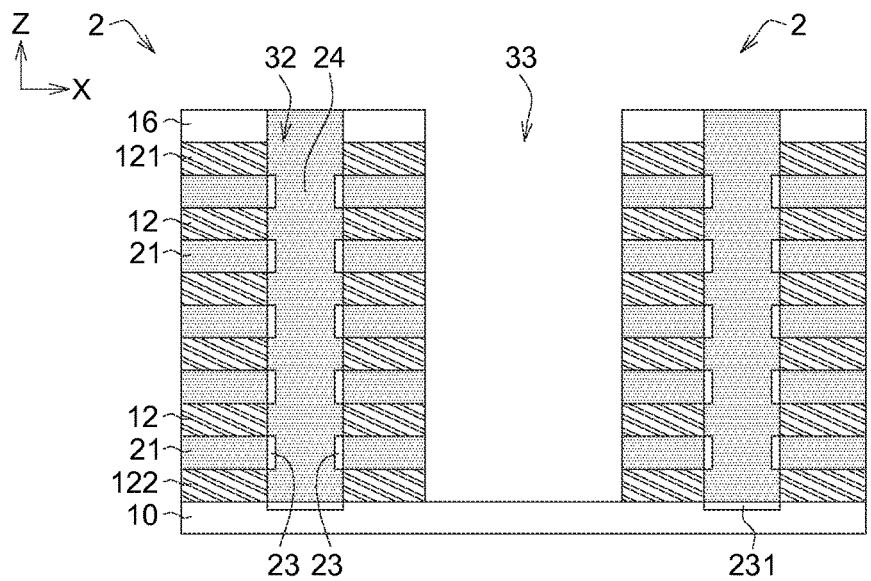

As shown in FIG. 7, at least one third through hole 33 is formed out of the predetermined area of the second stacked structure 2 (the area out of the area enclosed by the dashed line). Similarly, the third through hole 33 penetrates the oxide layers 12 and the silicon nitride layers 19. FIG. 8A illustrates a cross-section view of the structure along C-C' line in FIG. 7. FIG. 8B illustrates a cross-section view of the structure along D-D' line in FIG. 7.

As shown in FIGS. 7 and 8A, the silicon nitride layers 19 in the predetermined area of the first stacked structure 1 (out of the predetermined area of the second stacked structure 2) are removed. Similarly, the chemical dry etching or phosphoric acid may be used to remove the silicon nitride layers 19. The chemical dry etching or phosphoric acid may have much higher selectivity to oxide. Therefore, the silicon nitride layers 19 may be removed, but the oxide layers 12 may be remained. Further, the semiconductor layers 21 (the channels of the TFT structure) will not be damaged during this step due to the higher selectivity of the phosphoric acid to polysilicon and oxide.

Then, fill the metal material between the oxide layers 12 to form metal layers 11. Here, the metal layers 11 may include such as TiN/W. Besides, before the step of filling the metal material between the oxide layers 12, high dielectric material (not shown) may be filled to form the high dielectric material layers (not shown) between the metal layers 11 and the oxide layers 12.

The first stacked structure 1 may be formed after the step of filling the metal material between the oxide layers 12. The two first stacked structures 1 may be separated by the through hole 33 as shown in FIG. 7 and FIG. 8A. Similarly, the two second stacked structures 2 may be separated by the through hole 33 as shown in FIG. 7 and FIG. 8B.

Figure 9:
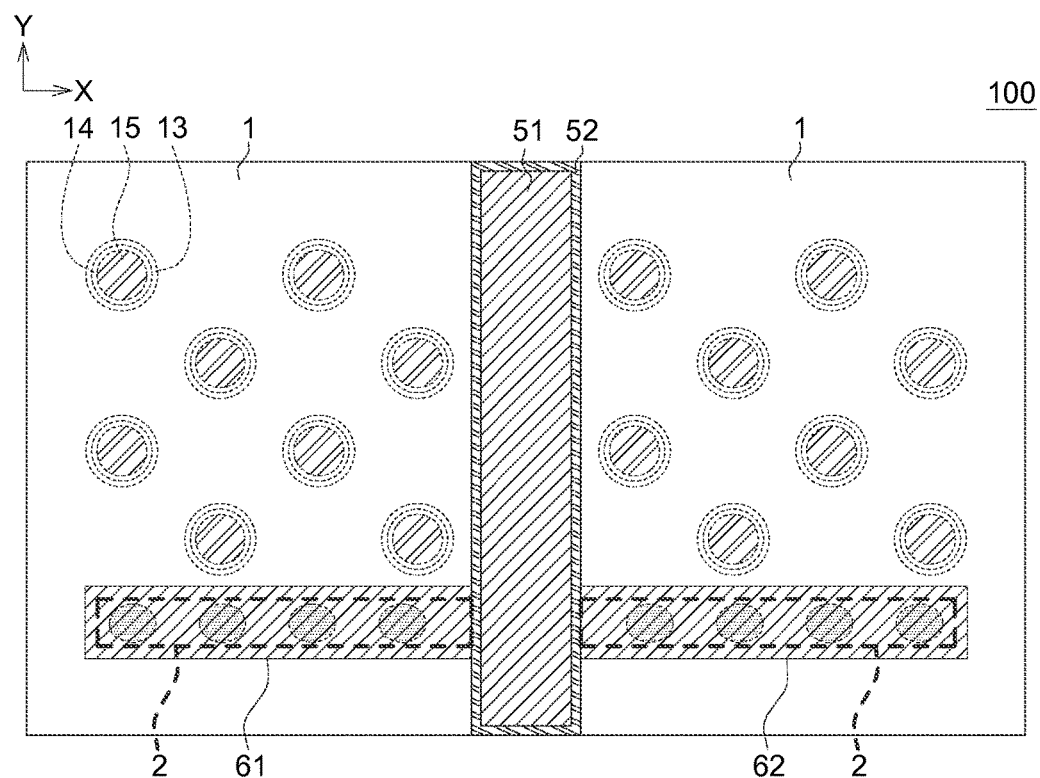

Then, at least one oxide spacer 52 and conductive structure 51 are sequentially formed in the third through hole 33 as shown in FIG. 9. That is, the oxide spacer 52 is disposed between the first stacked structure 1 (or the second stacked structure 2) and the conductive structure 51. Here, the conductive structure 51 may include TiN/W or TaN/W.

After the step of sequentially forming the oxide spacer 52 and conductive structure 51 in the third through hole 33, the memory device 100 as shown in FIG. 1 is formed. That is, after sequentially forming the oxide spacer 52 and conductive structure 51 in the third through hole 33 as shown in FIG. 8A, the structure as shown in FIG. 2C is formed; after sequentially forming the oxide spacer 52 and conductive structure 51 in the third through hole 33 as shown in FIG. 8B, the structure as shown in FIG. 2D is formed.

Besides, the memory device 100 in the embodiment according to the disclosure may further include a conductive line disposed on the second stacked structure 2 and electrically connected to the gate structure 24. For example, the conductive lines 61 and 62 are disposed on the two stacked structures 2 respectively to control the stacked structures 2 as shown in FIG. 9.

The memory device 100 may be operated by the following steps. First, some second stacked structures 2 are selected to be a selected TFT structure, and other second stacked structures 2 are a non-selected TFT structure. Then, a gate bias is applied to the selected TFT structure. In this embodiment, the gate bias may be between 2 and 10 V, such as 3.3 V.

Besides, one of the metal layers 11 of the first stacked structure 1 are selected to be a selected array, and other metal layers 11 are a non-selected array. The semiconductor layers 21 of the selected TFT structure which are connected to the selected array are turned on, such that the metal layers 11 in the selected array may be charged up. Here, the metal layers 11 may be used as word lines of the memory device 100.

For example, a gate bias may be applied to some second stacked structures 2 by the conductive line 61, and the conductive line 62 does not be applied any bias as shown in FIG. 9. That is, the second stacked structures 2 electrically connected to the conductive line 61 are the selected TFT structures, while the second stacked structures 2 electrically connected to the conductive line 62 are the non-selected TFT structures.

When the selected array connects to the selected TFT structure, the semiconductor layers 21 are turned on since the selected TFT structure has gate bias, such that the metal layers 11 of the selected array will be charged up. When the selected array connects to the non-selected TFT structure, the semiconductor layers 21 are turned off since the non-selected TFT structure does not have gate bias, such that the metal layers 11 of the selected array will not be charged up.

Therefore, whether metal layers 11 in the selected array will be turned on may be determined by the second stacked structures 2 (the TFT structure). Further, it is not necessary to have additional decoding method to select the TFT structures. The reason is that the gate structure 24 is connected to SSL (NAND String Select Line). If the selected SSL is on, then the gate structure 24 is also on at the same selected string. It is not necessary to add additional decoding circuitry for the second stacked structures 2. Since only the metal layers 11 connected to the selected TFT structures may be charged up, the total metal layers 11 (word lines) capacitance would be much reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A memory device, comprising:
a substrate;
a first stacked structure and another first stacked structure disposed on the substrate, and each of the first stacked structure and the another first stacked structure comprising a plurality of alternately stacked metal layers and oxide layers, and comprising a plurality of first through holes penetrating the metal layers and the oxide layers and a semiconductor material formed in the plurality of first through holes;

a second stacked structure and another second stacked structure disposed on the substrate, and each of the second stacked structure and the another second stacked structure comprising a plurality of alternately stacked semiconductor layers and oxide layers, and comprising a plurality of second through holes penetrating the semiconductor layers and the oxide layers and a metal material formed in the plurality of second through holes, wherein the metal layers of the first stacked structure are connected to the semiconductor layers of the second stacked structure, and the metal layers of the another first stacked structure are connected to the semiconductor layers of the another second stacked structure; and a conductive structure separating the first stacked structure from the another first stacked structure, and separating the second stacked structure from the another second stacked structure.

2. The memory device according to claim 1, wherein the plurality of first through holes exposes a portion of a surface of the substrate, and the first stacked structure and the another first stacked structure further comprise:

a charge storage layer disposed on a side wall of the plurality of first through holes; and a channel layer comprising the semiconductor material and disposed on the charge storage layer and the exposed portion of the surface of the substrate.

3. The memory device according to claim 2, wherein the first stacked structure and the another first stacked structure comprise:

a dielectric structure filled in the plurality of first through holes.

4. The memory device according to claim 2, wherein the charge storage layer is a silicon oxide/silicon nitride/silicon oxide/silicon nitride/silicon oxide structure.

5. The memory device according to claim 2, wherein the semiconductor material of the channel layer comprises polysilicon or indium gallium zinc oxide.

6. The memory device according to claim 1, wherein the plurality of second through holes exposes a portion of a surface of the substrate.

7. The memory device according to claim 6, further comprising at least one gate oxide layer disposed in the plurality of second through holes and on a surface of at least one of the semiconductor layers, wherein the at least one gate oxide layer is disposed on the exposed portion of the surface of the substrate.

8. The memory device according to claim 1, wherein at least one of the first stacked structure and the another first stacked structure further comprises a cap layer.

9. The memory device according to claim 1, wherein at least one of the first stacked structure and the another first stacked structure further comprises a high dielectric material layer disposed between the metal layers and the oxide layers.

10. The memory device according to claim 1, further comprising:

an oxide spacer disposed between the conductive structure and at least one of the first stacked structure and the another first stacked structure.

11. The memory device according to claim 1, wherein the conductive structure comprises a material of TiN and W or comprises a material of TaN and W.

12. The memory device according to claim 1, wherein the metal layers comprise a material of TiN and W.

13. The memory device according to claim 1, wherein the semiconductor layers comprise undoped polysilicon.

14. The memory device according to claim 1, further comprising an oxide spacer, wherein from a perspective of a top view of the memory device, the conductive structure is completely surrounded by the oxide spacer.

15. The memory device according to claim 14, wherein the oxide spacer is adjoined with the metal layers and the oxide layers of the first stacked structure and the another first stacked structure.

16. The memory device according to claim 15, wherein the oxide spacer is adjoined with the conductive structure.

17. The memory device according to claim 1, wherein the conductive structure extends completely through the metal layers and the oxide layers of the first stacked structure and the another first stacked structure.

18. The memory device according to claim 1, wherein the conductive structure extends completely through the metal layers and the oxide layers of at least one of the first stacked structure and the another first stacked structure, and the semiconductor layers and the oxide layers of at least one of the second stacked structure and the another second stacked structure.

19. The memory device according to claim 1, wherein the conductive structure extends completely through all of the metal layers and the oxide layers of at least one of the first stacked structure and the another first stacked structure, and all of the semiconductor layers and the oxide layers of at least one the second stacked structure and the another second stacked structure.

20. The memory device according to claim 1, further comprising:

an oxide spacer disposed between the conductive structure and at least one of the second stacked structure and the another second stacked structure.

21. The memory device according to claim 1, wherein at least one of the second stacked structure and the another second stacked structure comprises:

at least one gate oxide layer disposed in the plurality of second through holes and on a surface of at least one of the semiconductor layers; and a gate structure being a gate electrode and comprising the metal material, wherein from a perspective of a cross-sectional view of the memory device, the gate electrode is filled in the plurality of second through holes and has a recess recessed from a sidewall surface of the gate electrode, the sidewall surface of the gate electrode is adjoined with the oxide layers of the at least one of the second stacked structure and the another second stacked structure, the at least one gate oxide layer extended from a sidewall surface of at least one of the semiconductor layers is in the recess of the gate electrode, both of a top surface and a bottom surface of one gate oxide layer of the at least one gate oxide layer are adjoined with the gate electrode, wherein the top surface of the one gate oxide layer is farther away from the substrate than the bottom surface of the one gate oxide layer, the bottom surface and the top surface of the one gate oxide layer respectively face towards opposing directions, and the bottom surface of the one gate oxide layer faces down toward the substrate.

* * * * *